United States Patent [19]
Saito et al.

[11] Patent Number: 5,817,219
[45] Date of Patent: Oct. 6, 1998

[54] CARBON TARGET MATERIAL FOR FORMING CARBON THIN FILM AND PROCESS FOR PRODUCTION THEREOF

[75] Inventors: Kazuo Saito; Takeshi Ishimatsu, both of Tokyo, Japan

[73] Assignee: Nisshinbo Industries, Inc., Tokyo, Japan

[21] Appl. No.: 740,914

[22] Filed: Nov. 5, 1996

Related U.S. Application Data

[63] Continuation of Ser. No. 387,563, Feb. 13, 1995, abandoned.

[30] Foreign Application Priority Data

Feb. 28, 1994 [JP] Japan .................................. 6-054648

[51] Int. Cl.⁶ .................................................. C23C 14/34
[52] U.S. Cl. ................. 204/192.15; 204/192.16; 204/192.2
[58] Field of Search ...................... 204/192.15, 192.16, 204/192.2

[56] References Cited

U.S. PATENT DOCUMENTS

| | | | |
|---|---|---|---|
| 4,612,100 | 9/1986 | Edeling et al. | 204/192.15 |
| 4,774,130 | 9/1988 | Endo et al. | 204/192.2 X |
| 5,110,676 | 5/1992 | Murai et al. | 204/192.16 X |
| 5,122,249 | 6/1992 | Niemann et al. | 204/192.16 |
| 5,152,941 | 10/1992 | Takaku et al. | 423/445 R |
| 5,453,168 | 9/1995 | Nelson et al. | 204/192.2 X |

*Primary Examiner*—Nam Nguyen
*Attorney, Agent, or Firm*—Kubovcik & Kubovcik

[57] ABSTRACT

A carbon target material for forming a carbon thin film, includes a vitreous carbon produced from a polycarbodiimide resin. A process for producing a carbon target material for forming a carbon thin film includes molding into an appropriate shape a polycarbodiimide or a composition primarily composed of a polycarbodiimide and then carbonizing the resulting shaped material.

The carbon target material for forming a carbon thin film; causes no abnormal discharge during sputtering generates no powder leading to contamination during sputtering, and has high purity.

10 Claims, No Drawings

5,817,219

CARBON TARGET MATERIAL FOR FORMING CARBON THIN FILM AND PROCESS FOR PRODUCTION THEREOF

This application is a continuation of application Ser. No. 08/387,563 filed Feb. 13, 1995, now abandoned.

BACKGROUND OF THE INVENTION (1) Field of the Invention

The present invention relates to a carbon target material for forming a carbon thin film. More particularly, the present invention relates to a carbon target material capable of forming, on a hard disc, a semiconductor, a magnetic head, a glass, a metal or the like, a carbon thin film usable as a antifriction layer, an oxidation-resistant layer, a moisture-resistant layer, a weathering layer, an antireflection layer or the like.

(2) Prior Art

In recent years, with the technological advances in computers, etc., the requirements for thin-film technology have become increasingly strict. As a result, expectation is high for a carbon target material capable of forming a carbon thin film usable as an antifriction layer, an oxidation-resistant layer, a moisture-resistant layer, a weathering layer, an antireflection layer or the like.

As an example of the field in which said thin-film technology is applied, there can be cited magnetic discs. Disc-shaped magnetic discs allowing for random access are currently in wide use as a recording medium of computers, etc. In particular, magnetic discs made of a hard material such as aluminum alloy plate, glass plate, plastic plate or the like are in use in large amounts because of their excellent response, large memory capacity, excellent storability and high reliability.

These magnetic discs are used while being rotated. When recording or regeneration is conducted using said magnetic disc, the disc is in a static state before the start of the operation and its magnetic layer is in contact with a magnetic head; once the operation is started, the magnetic disc is rotated at a high speed and the magnetic layer faces the magnetic head with a very small gap being held between them; at the completion of the operation, the magnetic disc comes again in contact with the magnetic head. This is a general method of using a magnetic disc and is called a contact-start-stop method (hereinafter referred to as CSS method).

Thus, in the CSS method, the magnetic layer of the magnetic disc and the magnetic head make contact with each other repeatedly at the start and completion of the operation of recording or regeneration. As a result, the friction force generated between the magnetic layer and the magnetic head causes the abrasion of the magnetic head or the magnetic disc; and the adherence of dust or powder (detached from the magnetic layer) on the magnetic disc may invite head crash or sudden collision of the magnetic head with the magnetic layer. These problems are not desirable in view of the reliability, durability, etc. of recording or regeneration.

In this connection, it has been studied to form a carbon protective film of about several hundred nm in thickness on the surface of a magnetic recording medium to improve the durability of the medium. The protective film is generally formed by sputtering using a carbon sintered material as a target material. The carbon sintered material used herein is obtained by mixing natural graphite, artificial graphite or the like with a pitch, a resin or the like, molding the mixture, and firing and carbonizing the molded material to obtain a graphite, and is called a graphite material.

This carbon sintered material (graphite material) being in general use in sputtering to form a carbon protective film, however, has many pores of 0.1 µm or larger in diameter on the surface, when this carbon sintered material is used as a target material, rises (which appear to be accumulations at a glance) consisting of a material having lower bulk density than that of the target material are formed on the surface of the target material, and the existence of such pores and rises causes not only a loss of smoothness on the surface of the target material, but also abnormal discharge during sputtering at the pores and rises, resulting in flying of carbon powder of several tens of nm to several mm (this carbon powder is generated by the destruction of the carbon sintered material) in the sputtering chamber, contamination of the sputtering film and reduction in product yield.

This abnormal discharge is a serious problem in high-technology fields such as semiconductors, hard discs and the like. Hence, it has been desired to develop a carbon target material for forming a carbon thin film of high purity which causes no abnormal discharge and generates no powder and no contamination.

OBJECT AND SUMMARY OF THE INVENTION

In view of the above-mentioned problems of the prior art, the object of the present invention is to provide a carbon target material having properties as mentioned above, suitably used for sputtering.

According to the present invention there are provided:

a carbon target material for forming a carbon thin film consisting essentially of a carbon material produced from a polycarbodiimide resin, and a process for producing a carbon target material for forming a carbon thin film, which comprises molding into an appropriate shape a polycarbodiimide or a composition mainly comprising a polycarbodiimide and then carbonizing the resulting shaped material.

DETAILED DESCRIPTION OF THE INVENTION

The present invention is hereinafter described in detail.

The polycarbodiimide resin used in the present invention is known per se, or can be produced by known processes [reference is made to, for example, U.S. Pat. No. 2,941,956; Japanese Patent Publication No. 33279/1972; J. Org. Chem., 28, 2069–2075 (1963); and Chemical Review 1981, Vol. 81, No. 4, 619–621]. It can easily be produced, for example, by subjecting an organic diisocyanate to a condensation reaction (wherein carbon dioxide is removed) in the presence of a carbodiimidization catalyst.

The organic diisocyanate used in the production of the polycarbodiimide resin can be any of an aliphatic type, an alicyclic type, an aromatic type, an aromatic-aliphatic type, etc. They can be used singly or in an admixture of two or more (in the latter case, a copolymer is produced).

Examples of the organic diisocyanate are 2,4-tolylene diisocyanate, 2,6-tolylene diisocyanate, a mixture thereof, crude tolylene diisocyanate, xylene diisocyanate, m-phenyl diisocyanate, naphthylene-1,5-diisocyanate, 4,4-biphenylene diisocyanate, 3,3-dimethoxy-4,4-biphenyl diisocyanate, and mixtures thereof.

The polycarbodiimide resin used in the present invention includes homopolymers and copolymers containing at least one recurring unit represented by the following formula

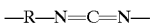

wherein R represents an organic diisocyanate residue.

The above R (organic diisocyanate residue) is preferably an aromatic diisocyanate residue. Herein, "organic diisocyanate residue" refers to an organic diisocyanate moiety which remains when two isocyanate groups (NCO) are removed from one organic diisocyanate molecule. Examples of such a polycarbodiimide resin include the resins represented by the following formulas.

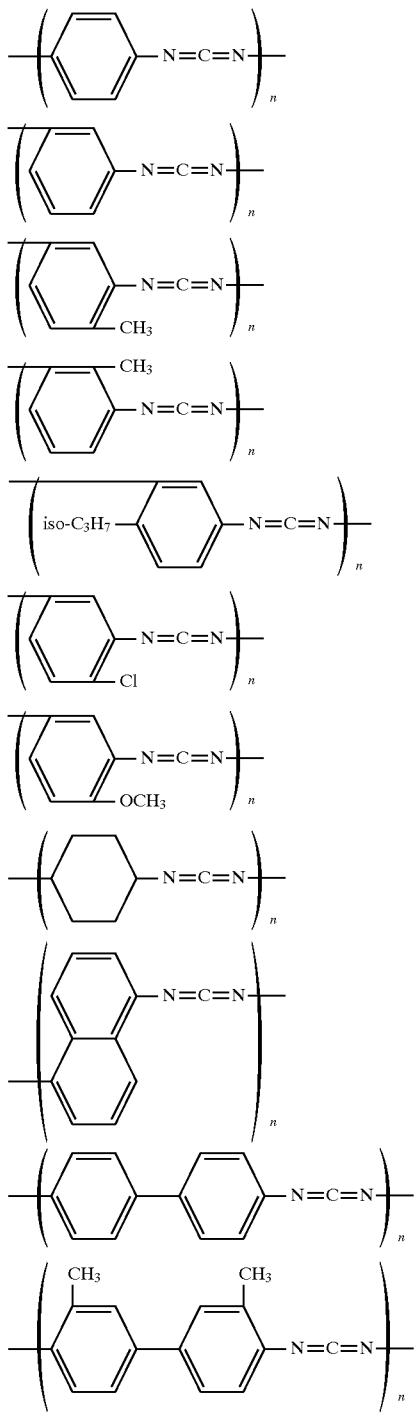

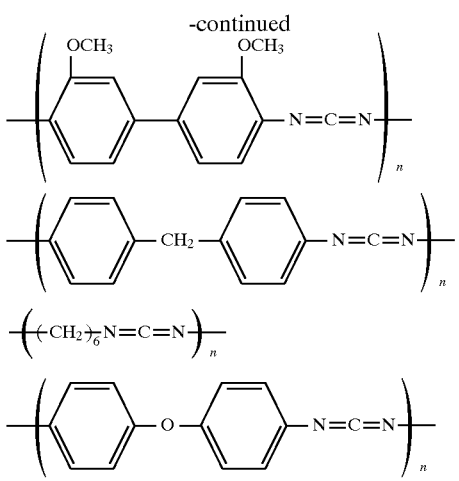

In each of the above formulas, n is 10–10,000, preferably 50–5,000. The terminals of each polycarbodiimide resin may be blocked with a monoisocyanate or the like for control of the molecular weight of the polycarbodiimide resin. Examples of the monoisocyanate are phenyl isocyanate, o-, m- or p- tolyl isocyanate, dimethylphenyl isocyanate, cyclohexyl isocyanate and methyl isocyanate.

The polycarbodiimide resin can be obtained as a reaction mixture containing said resin, or as a powder obtained by precipitating said resin from the reaction mixture. The polycarbodiimide resin, when obtained as a reaction mixture, is used per se or as a powder obtained by removing the solvent and, when obtained as a powder, is used per se or as a solution obtained by dissolution in a solvent.

In the present invention, the polycarbodiimide powder or its solution is first molded into a shaped material, for example, a plate. The molding method is not particularly restricted and can be any method generally used in such molding, such as injection molding, compression molding, casting molding, vacuum molding, extrusion molding or the like.

Then, the shaped material is heated to carbonize the polycarbodiimide resin, whereby a carbon target material for forming a carbon thin film consisting essentially of a carbon material produced from a polycarbodiimide resin, and intended by the present invention can be obtained. This carbonization can be conducted in a vacuum or in an inert atmosphere such as nitrogen gas or the like. The final firing temperature in the carbonization is preferably 1,000°–3,000° C.

In this firing process, the rate of temperature elevation to the final carbonization temperature is preferably 2° C./hour or less. Reaching the final carbonization temperature rapidly is undesirable, because porosity increases to 0.02% or higher, moreover, pores of 0.1 $\mu$m or more are produced on the surface.

The thus obtained carbon target material of the present invention was very dense and homogeneous, and when measured for properties, had, for example, a porosity of 0–0.019%, a bulk density of 1.51–1.70 g/cm$^3$, and Shore hardness of 121–140. In addition, the carbon target material of the present invention causes no abnormal discharge during sputtering, because it does not have any pore of 0.1 $\mu$m or larger in diameter on the surface and deformation of the surface due to rises during sputtering does not occur. Thus, the carbon target material was quite excellent.

Incidentally, formation of a protective film from the carbon target material of the present invention can be conducted by subjecting said carbon target material to sputtering in the conventional manner.

The method of the sputtering differs by the method of gas discharge employed and can be appropriately selected from DC diode sputtering, DC triode sputtering, high-frequency sputtering, magnetron sputtering, etc. The conditions of the sputtering can be those ordinarily employed, and are $10^{-2}$ to $10^{-5}$ Torr (argon gas pressure) and 0.1–100 KW (input power) in the case of high-frequency sputtering and 0.1–100 KW (input power) in the case of DC sputtering.

The present invention is hereinafter described in more detail by way of Examples.

EXAMPLE 1

54 g of a 80:20 mixture (TDI) of 2,4-tolylene diisocyanate and 2,6-tolylene diisocyanate was reacted in the presence of 0.12 g of a carbodiimidization catalyst (1-phenyl-3-methylphospholene oxide) in 500 ml of tetrachloroethylene at 120° C. for 5 hours, whereby a polycarbodiimide solution was obtained.

The reaction mixture was poured into a laboratory dish, dried at 60° C. for 20 hours and at 120° C. for 20 hours, and heated to 200° C. at a temperature elevation rate of 1° C./hour to obtain a cured plate. The cured plate was heated to 2,000° C. at a temperature elevation rate of 2° C./hour to obtain a carbon target material of 5 in.×15 in.×5 mm (thickness). The target material had excellent properties as shown in Table 1. In Table 1, "surface defect" refers to the number of pores of 0.1 μm or more at the surface.

Then, DC sputtering was conducted for 10 hours continuously using the above target material, under the conditions of $5\times10^{-3}$ Torr (argon gas pressure) and 500 W (input power). During the sputtering, the time of abnormal discharge was 0. Observation of the target surface after the sputtering indicated that there was neither adhesion of any foreign matter nor formation of any projection and the surface had good gloss.

Also using the above target material, magnetron sputtering was conducted for 10 hours under the conditions of $3\times10^{-3}$ Torr (argon gas pressure) and 600 W (input power). During the sputtering, the time of abnormal discharge was 0. Observation of the target surface after the sputtering indicated that there was neither adhesion of any foreign matter nor formation of any projection and the surface had good gloss.

Further using the above target material, magnetron sputtering was conducted under the conditions of $3\times10^{-3}$ Torr (argon gas pressure) and 600 W (input power), on a magnetic disc of 3.5 in. in diameter having a cobalt-nickel alloy magnetic layer formed by sputtering, whereby a carbon protective film of 250 Å in thickness was formed. The resulting magnetic disc was measured for static friction coefficient of surface, which was 0.4 and good. Also, the above operation of protective film formation was conducted for 2,000 magnetic discs, and the yield was 99.7% and was very good.

EXAMPLE 2

50 g of methylene diphenyl diisocyanate (MDI) was reacted in the presence of 0.12 g of a carbodiimidization catalyst (1-phenyl-3-methylphospholene oxide) in 880 ml of tetrahydrofuran at 68° C. for 15 hours, whereby a polycarbodiimide solution was obtained.

The reaction mixture was poured into a laboratory dish, dried at 40° C. for 20 hours and at 120° C. for 40 hours, and heated to 200° C. at a temperature elevation rate of 1° C./hour to obtain a cured plate. The cured plate was heated to 1,900° C. at a temperature elevation rate of 2° C./hour to obtain a carbon target material of 5 in.×15 in.×5 mm (thickness). The target material had excellent properties as shown in Table 1.

Then, DC sputtering was conducted using the above target material, under the same conditions as in Example 1. During the sputtering, the time of abnormal discharge was 0. Observation of the target surface after the sputtering indicated that there was neither adhesion of any foreign matter nor formation of any projection and the surface had good gloss.

EXAMPLE 3

54 g of diphenyl ether diisocyanate was reacted in the presence of 0.12 g of a carbodiimidization catalyst (1-phenyl-3-methylphospholene oxide) in 850 ml of tetrahydrofuran at 68° C. for 15 hours, whereby a polycarbodiimide solution was obtained.

The reaction mixture was poured into a laboratory dish, dried at 40° C. for 20 hours and at 120° C. for 30 hours, and heated to 200° C. at a temperature elevation rate of 1° C./hour to obtain a cured plate. The cured plate was heated to 1,700° C. at a temperature elevation rate of 2° C./hour to obtain a carbon target material of 5 in.×15 in.×5 mm (thickness). The target material had excellent properties as shown in Table 1.

Then, DC sputtering was conducted using the above target material, under the same conditions as in Example 1. During the sputtering, the time of abnormal discharge was 0. Observation of the target surface after the sputtering indicated that there was neither adhesion of any foreign matter nor formation of any projection and the surface had good gloss.

Comparative Example 1

A graphite material (a product of Toyo Carbon having a specific gravity of 1.80) was processed into the same shape as in Example 1 to obtain a carbon target material. The properties of the target material are shown in Table 1.

Using this target material, magnetron sputtering was conducted for 10 hours under the conditions of $3\times10^{-3}$ Torr (argon gas pressure) and 600 W (input power). During the sputtering, abnormal discharge occurred 20 times. Observation of the target surface after the sputtering indicated rises appearing as black deposits at 20 places.

Further using the above target material, magnetron sputtering was conducted under the conditions of $3\times10^{-3}$ Torr (argon gas pressure) and 600 W (input power), on a magnetic disc of 3.5 in. in diameter having a cobalt-nickel alloy magnetic layer formed by sputtering, whereby a carbon protective film of 250 Å in thickness was formed. The resulting magnetic disc was measured for static friction coefficient of surface, which was 2.0 and high. Also, the above operation of protective film formation was conducted for 2,000 magnetic discs, and the yield was 50% and was very low.

Comparative Example 2

A novolac type phenol-formaldehyde resin was molded into a plate by melt molding, and carbonized under the same conditions as in Example 1 to obtain a carbon target material. The properties of the target material are shown in Table 1.

Using this target material, magnetron sputtering was conducted for 10 hours under the conditions of $3\times10^{-3}$ Torr (argon gas pressure) and 600 W (input power). During the sputtering, abnormal discharge occurred 10 times. Observation of the target surface after the sputtering indicated rises appearing as black deposits at 18 places.

Comparative Example 3

A cured plate obtained in Example 1 was heated to 2000° C. at a temperature elevation rate of 5° C./hour, to obtain a carbon target material of the same shape as in Example 1. The properties of the target material are shown in Table 1.

Using this target material, DC sputtering was conducted under the same conditions as in Example 1. During the sputtering, abnormal discharge occurred 10 times. Observation of the target surface after the sputtering indicated rises appearing as black deposits at 10 places.

TABLE 1

| | Bulk density (g/cm³) | Surface defect | Shore hardness | Porosity (%) |
|---|---|---|---|---|
| Example 1 | 1.57 | 0 | 130 | 0 |
| Example 2 | 1.64 | 0 | 134 | 0.01 |
| Example 3 | 1.67 | 0 | 135 | 0 |
| Comparative Example 1 | 1.80 | Too many and impossible to measure | 40 | 15 |
| Comparative Example 2 | 1.45 | 1.70 | 95 | 9 |
| Comparative Example 3 | 1.56 | 10 | 130 | 1.5 |

What is claimed is:

1. A method of forming a carbon film protective layer on a magnetic recording medium comprising:
   providing, as a carbon target, a vitreous carbon produced by carbonizing a polycarbodiimide resin at a temperature elevation of not greater than 2° C./hour; and
   sputtering carbon from said carbon target onto a magnetic recording medium to form said carbon film protective layer.

2. The method of claim 1, wherein the carbon target has a bulk density of 1.51–1.70 g/cm³ and a porosity of 0–0.019%.

3. The method of claim 1, wherein pores on a surface of the carbon target have a diameter no greater than 0.1 μm.

4. The method of claim 1, wherein the polycarbodiimide resin is carbonized in a vacuum or an inert atmosphere.

5. The method of claim 4, wherein the carbonization is conducted at a temperature within a range of from 1,000° C. to 3,000° C.

6. A method of forming a carbon film on a semiconductor comprising the steps of:
   providing, as a carbon target, a vitreous carbon produced by carbonizing a polycarbodiimide resin at a temperature elevation of not greater than 2° C./hour; and
   sputtering carbon from said carbon target onto a semiconductor to form said carbon film.

7. The method of claim 6, wherein the carbon target has a bulk density of 1.51–1.70 g/cm³ and a porosity of 0–0.019%.

8. The method of claim 6, wherein pores on a surface of the carbon target have a diameter no greater than 0.1 μm.

9. The method of claim 6, wherein the polycarbodiimide resin is carbonized in a vacuum or an inert atmosphere.

10. The method of claim 9, wherein the carbonization is conducted at a temperature within a range of from 1,000° C. to 3,000° C.

* * * * *